United States Patent
Sugiura et al.

(10) Patent No.: US 6,914,816 B2
(45) Date of Patent: *Jul. 5, 2005

(54) NON-VOLATILE SEMICONDUCTOR MEMORY

(75) Inventors: Yoshihisa Sugiura, Kamakura (JP); Takashi Suzuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/957,697

(22) Filed: Oct. 5, 2004

(65) Prior Publication Data

US 2005/0047207 A1 Mar. 3, 2005

Related U.S. Application Data

(63) Continuation of application No. 10/455,450, filed on Jun. 6, 2003, now Pat. No. 6,839,276.

(30) Foreign Application Priority Data

Jun. 7, 2002 (JP) ...................................... 2002-167314

(51) Int. Cl.$^7$ .............................................. G11C 16/00
(52) U.S. Cl. ............................. 365/185.11; 365/185.18; 365/185.28
(58) Field of Search ...................... 365/185.11, 185.18, 365/185.28, 185.09

(56) References Cited

U.S. PATENT DOCUMENTS

| | | | |
|---|---|---|---|
| 5,388,083 A | 2/1995 | Assar et al. | 365/218 |
| 5,818,755 A | 10/1998 | Koyanagi et al. | 365/185.11 |
| 6,000,843 A | 12/1999 | Sawada | 371/21.4 |
| 6,418,055 B1 | 7/2002 | Asami et al. | 365/185.2 |
| 6,571,312 B1 * | 5/2003 | Sugai et al. | 711/103 |
| 6,735,121 B2 | 5/2004 | Yoshida | 365/185.22 |
| 6,744,670 B2 | 6/2004 | Tamada et al. | 365/185.19 |

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A non-volatile semiconductor memory is disclosed, which comprises a plurality of memory cell arrays each having a number-of-rewrites storage region allocated to a portion of a corresponding cell array, and a number-of-rewrites write control circuit which stores the number of rewrites in cell transistors of the number-of-rewrites storage regions in non-selected memory cell arrays of the plurality of memory cell arrays by executing write of data to the cell transistors at a voltage lower than an ordinary write voltage so as to change a threshold value of the cell transistors in analog fashion according to an amount of electrons injected into floating gates of the cell transistors.

27 Claims, 7 Drawing Sheets

NON-VOLATILE SEMICONDUCTOR MEMORY

CROSS-REFERENCE TO RELATED APPLICATIONS

This application is a continuation of U.S. patent application Ser. No. 10/455,450 now U.S. Pat. No. 6,839,276, filed Jun. 6, 2003, which is based upon and claims the benefit of priority from the prior Japanese Patent Application No. 2002-167314, filed Jun. 7, 2002, the entire contents of each of which are incorporated herein by reference.

BACKGROUND OF THE INVENTION

1. Field of the Invention

The present invention relates to a non-volatile semiconductor memory, and more particularly, to a control circuit for use in, for example, a NAND type flash memory to control writing of the number of rewrites of data.

2. Description of the Related Art

FIG. 2 is an equivalent circuit diagram showing an example of a NAND cell taken out from a portion of a certain cell block BLOCKm as NAND cells used in cell block of a NAND type flash memory.

The NAND cell is composed of 16 memory cells CT0 to CT15 connected in series. One ends of the memory cells are connected to bit lines BLi (BLn, BLn+1, . . . ) through a drain side selection gate transistor DGT, while the other ends thereof are connected to a source line through a source side selection gate transistor SGT. Each of the memory cells TC0 to CT10 is composed of a cell transistor having a double layer gate structure of a floating gate and a control gate, and word lines WLi (WL0 to WL15) are connected to the control gate.

Further, a drain side selection gate line SGD is connected to the control gate of-the drain side selection gate transistor DGT, while a source side selection gate line SGS is connected to the control gate of the source side selection gate transistor SGT.

An example of an operation of the NAND type flash memory and an example of an operation of the NAND cell will be briefly described.

Write (program) and erase to the NAND cell are executed by supplying an FN tunnel current to a tunnel oxide film of the cell transistor and injecting and discharging electrons into and from the floating gate of the cell transistor.

That is, in write, the potential of the bit lines BLi is set to the ground potential (Gnd, 0V) and a write voltage Vpgm (for example, 20V) is applied to a selected word line, thereby electrons are injected into the floating gate by a large potential difference caused by the floating gate and a channel of a selected cell transistor. At this time, a power-supply voltage Vdd is supplied to the drain side selection gate line SGD connected in series to the selected cell transistor, and the drain side selection gate transistor DGT is conducting. Further, a non-selection word line write voltage Vpass (for example, 10V) is applied to non-selected word lines and the non-selected cell transistors are conducting, thereby the potential of the bit lines BLi is transferred to the channel portion of the selected cell transistor. A 0 volt is supplied to the source side selection gate line SGS, and the source side selection gate transistor SGT is nonconducting.

Since write is executed at a time to a one page including a plurality of cell transistors commonly connected as a unit to a single word line, there are cell transistors whose data is set to "1" (which have no electrons injected into the floating gates thereof and keep an erased state) in the plurality of cell transistors to which write is executed at the same time.

At the beginning of write to the selected cell transistor having the data 1, when the potential of the word line reaches Vpgm or Vpass after a bit line potential Vdd is transferred to the channel of the cell transistor, the potential of the channel portion is risen by a gate capacitance. At this time, when the potential of the channel of the selection cell transistor becomes higher than Vdd+Vth, the drain side selection gate transistor DGT, which is connected in series to the selected cell transistor, become nonconducting because Vdd is applied to the gate line SGD.

The potential of the channel of the selected cell transistor rises to about 9V while this is determined depending on a ratio of the capacitance between the word line and the floating gate and the capacitance between the floating gate and the channel. With the above operation, since the potential difference between the floating gate and the channel of the selected cell transistor lowers, the FN tunnel current decreases in proportion to the square of an electric field, thereby no writing is executed to the selected cell transistor in an ordinary write time and the cell transistor keeps an erased state.

To execute write to the one page at a time, data registers/sense amplifiers are connected in correspondence to the respective bit lines and temporarily hold write data, respectively.

FIG. 8 is a circuit diagram showing an example of a sense amplifier/data register taken out from the data registers also acting as the sense amplifiers used in the NAND type flash memory in detail.

The sense amplifier/data register is arranged such that a pair of sense input transistors SA0 and AS1, and a pair of I/O gate transistors CTS, which are driven by a column selection signal CSL, are connected to a data register (latch circuit) REG composed of two cross-connected inverters. The source common connection node of the pair of sense input transistors SA0 and SA1 is connected the ground potential Gnd through a sense amplifying NMOS transistor SAT.

Further, one of the input/output nodes of the data register REG is commonly connected to a pair of bit lines of an even number column and an odd number column through a write control transistor WT controlled by a write signal PROGRAM. In this case, the pair of bit lines of the even number column and the odd number column are selectively connected to the write control transistor WT by an even number column bit line selection control transistor EBT and an odd number column bit line selection control transistor OBT.

A reset transistor RT is connected to the other I/O node of the data register REG to reset the data register to a "1" state and is controlled by a reset signal RST.

Next, write, erase and read operations will be briefly explained with reference to FIG. 8.

In the write operation, write data, which is supplied from a pair of input/output lines IO, /IO through the pair of input/output gate transistors CST, is temporarily held in the data register REG. The write data is transferred to the bit line of a selected even number column or a selected odd number column through the write control transistor WT and the bit line selection control transistor EBT of the selected even number column or the bit line selection control transistor OBT of the selected odd number column. When the write data is "0", 0V is transferred to the bit line, and when the write data is "1", Vdd is supplied thereto.

The erase operation is executed by extracting the electrons in the floating gate to the semiconductor substrate by setting an erase voltage (for example, 21V) to the well region of the memory cell and setting 0V to the word line. Although the erase is executed on a block-by-block basis, the word lines of non-selected blocks, which are not to be erased, remain in a floating state. When the voltage of the well region is set to Vera, the potential of the floating gates potential rises by the capacitance coupling between the substrate and the word lines through the floating gates. Accordingly, in the non-selected blocks, the potential difference between the floating gates and the substrate is lowered and erase is not executed.

The read operation is executed on a page-by-page basis similarly to the write operation. At the beginning of the read operation, the data register REG is reset to the "1" state in response to the reset signal RST. Then, at the beginning of the read operation, the bit line is precharged through a precharging PMOS transistor PRT controlled by a precharge signal PRECHARGE and through an NMOS transistor RT having a gate to which a read signal READ is applied. At this time, the voltage of the read signal READ is controlled so as to set the precharge voltage of the bit line to Vdd or to set it to a potential lower than Vdd in order to increase a read speed.

Further, the activation control NMOS transistor is controlled to a "on" state by the potential at one end of the precharging PMOS transistor PRT.

Thereafter, the drain side selection gate transistor DGT and the source side selection gate transistor SGT shown in FIG. 2 are turned on while maintaining the selected word line at 0 volt to thereby determine whether or not the potential of the bit line is discharged. At this time, to allow a sufficient cell current to flow in the cell transistor connected in series to the selection cell transistor, a read voltage Vread (for example, 3.5V) is supplied to the word line corresponding to the cell transistor.

When the data of the selected cell transistor is set to "1" (when erased), since the threshold value of the transistor is lowered to a negative level, the cell current flows even if the word line is at 0V, and thus the potential of the bit line is discharged.

When the data of the selection cell transistor is set to "0" (when written), since the threshold value of the transistor is increased to 0V or more, the selected cell transistor is nonconducting, and thus the potential of the bit line remains precharged.

Thereafter, the NMOS transistor RT is turned on in response to the read signal READ, the voltage of the bit line is received by a sense amplifying NMOS transistor, a sense input NMOS transistor SA is turned on in response to a sense signal SENSE0, and the data read from the selected cell transistor is temporarily held in the data register REG. The data held in the data register REG is serially read out.

Incidentally, as bit lines are made finer, a parasitic capacitance between adjacent bit lines increases. To prevent erroneous reading caused by the increase of the parasitic capacitance, a bit line shield technology is employed as briefly explained below.

As described above, in read, whether or not a precharge potential is discharged by the cell current is determined by floating the bit line. When bit lines have a large width and adjacent bit lines are disposed at large intervals because a design rule is moderate, almost all the parasitic capacitance of a bit line is attributed to the capacitance between the bit line and the substrate, so that a read operation is not effected by the operation of the bit line.

When, however, bit lines are made thinner and intervals therebetween are made smaller by application of a more strict design rule, the parasitic capacitance of the bit lines mainly results from the capacitance therebetween. In such circumstances, a case is examined in which data "0" is written to a memory cell on a target bit line to which notice is paid and data "1" is written to two bit lines adjacent to the target bit line.

In this case, although the precharge potential of the target bit line must be maintained without being discharged, the precharge potentials of the two adjacent bit lines are discharged. Accordingly, the potential of the target bit line is also lowered by the capacitance coupling between the two adjacent bit lines, thereby the data "0" of the memory cell on the target bit line is erroneously read out as data "1".

In the bit line shield technology used to prevent the above disadvantage, alternate bit lines are physically selected, and the potential of not selected bit lines are set to ground potential Gnd. With this arrangement, no erroneous read occurs because the potential difference of the parasitic capacitance between adjacent bit lines is fixed.

Note that in the bit line shield technology described above, a bit line of an even column and a bit line of an odd column are selected in correspondence to each other by a signal BL-even and a signal BL-odd. Further, although the number of memory cells connected to a single word line is doubled, a page size is controlled so as not to be changed by addressing when it is externally viewed.

When write/erase is executed to a flash memory, since electrons are injected into the oxide film, which is intrinsically an insulting film, of a cell transistor, the characteristics of the oxide film changes while the write/erase is repeated, thereby the write/erase characteristics of the flash memory are deteriorated.

In a NAND type flash memory, there occurs a phenomenon that an increase in the number of data rewrites (write/erase) increase a threshold value in erase. This is because an electron trap (trap level) occurs in an oxide film and electrons trapped therein prevent a tunnel current.

To obtain erase characteristics similar to initial ones regardless of an increase in the number of data rewrites, a higher erase voltage Vera or a longer erase time is necessary. Usually, there is taken a countermeasure to set an appropriate margin to an erase voltage/time so that, even if the characteristics of a memory cell is deteriorated by executing rewrite many times, the deterioration is not recognized as the deterioration of the device.

However, setting the appropriate margin to the erase voltage/time acts as excessive stress to a memory cell in an initial state, which results in that the memory cell is deteriorated rapidly. To execute erase under a most suitable condition at each timing without applying excessive stress, there is contemplated a method of adjusting the voltage or the time according to the number of data rewrites.

To realize this method, it is contemplated to store the number of data rewrites in a register and to adjust an internal voltage and the like by a controller according to the number of data rewrites. The register for storing the number of data rewrites must have a non-volatile property because it must hold information even if a power supply thereto is cut off.

In particular, since flash memories guarantee to execute rewrite 100,000 times to 1,000,000 times in a specification, a circuit is increased in size because control must be executed to count such a large number of rewrites in digital fashion and to store it in a multiplicity of storage devices (for example, 20-bits non-volatile registers) similar to, for example, memory cells.

As described above, conventional flash memories have a problem in that they must execute control to count a large number of rewrites in digital fashion and store it in many non-volatile registers, to thereby adjust a voltage, time, and the like in correspondence to deterioration of the write/erase characteristics thereof due to an increase in number of rewrites, and a circuit is increased in size.

BRIEF SUMMARY OF THE INVENTION

According to an aspect of the present invention, there is provided a non-volatile semiconductor memory comprising a plurality of memory cell arrays each having a number-of-rewrites storage region allocated to a portion of a corresponding cell array; and a number-of-rewrites write control circuit which stores the number of rewrites in cell transistors of the number-of-rewrites storage regions in non-selected memory cell arrays of the plurality of memory cell arrays by executing write of data to the cell transistors at a voltage lower than an ordinary write voltage so as to change a threshold value of the cell transistors in analog fashion according to an amount of electrons injected into floating gates of the cell transistors.

According to another aspect of the present invention, there is provided a non-volatile semiconductor memory comprising a plurality of memory cell arrays each having a number-of-rewrites storage region allocated to a portion of a corresponding memory cell array; plurality of sense amplifiers/data registers commonly connected to a pair of bit lines of a pair of even and odd columns in each of the memory cell arrays; and a number-of-rewrites write control circuit which stores, when data is written to cell transistors connected to one of the pair of bit lines of the pair of even and odd columns in the number-of-rewrites storage regions of selected memory cell arrays, the number of rewrites to the cell transistors connected to the other of the pair of bit lines by executing write by supplying the cell transistors with a voltage lower than an ordinary write voltage to so as to change a threshold value of the cell transistors in analog fashion according to an amount of electrons injected into floating gates of the cell transistors.

DETAILED DESCRIPTION OF THE INVENTION

Embodiments of the present invention will be described below in detail with reference to the drawings.

(First Embodiment)

Figure 1:
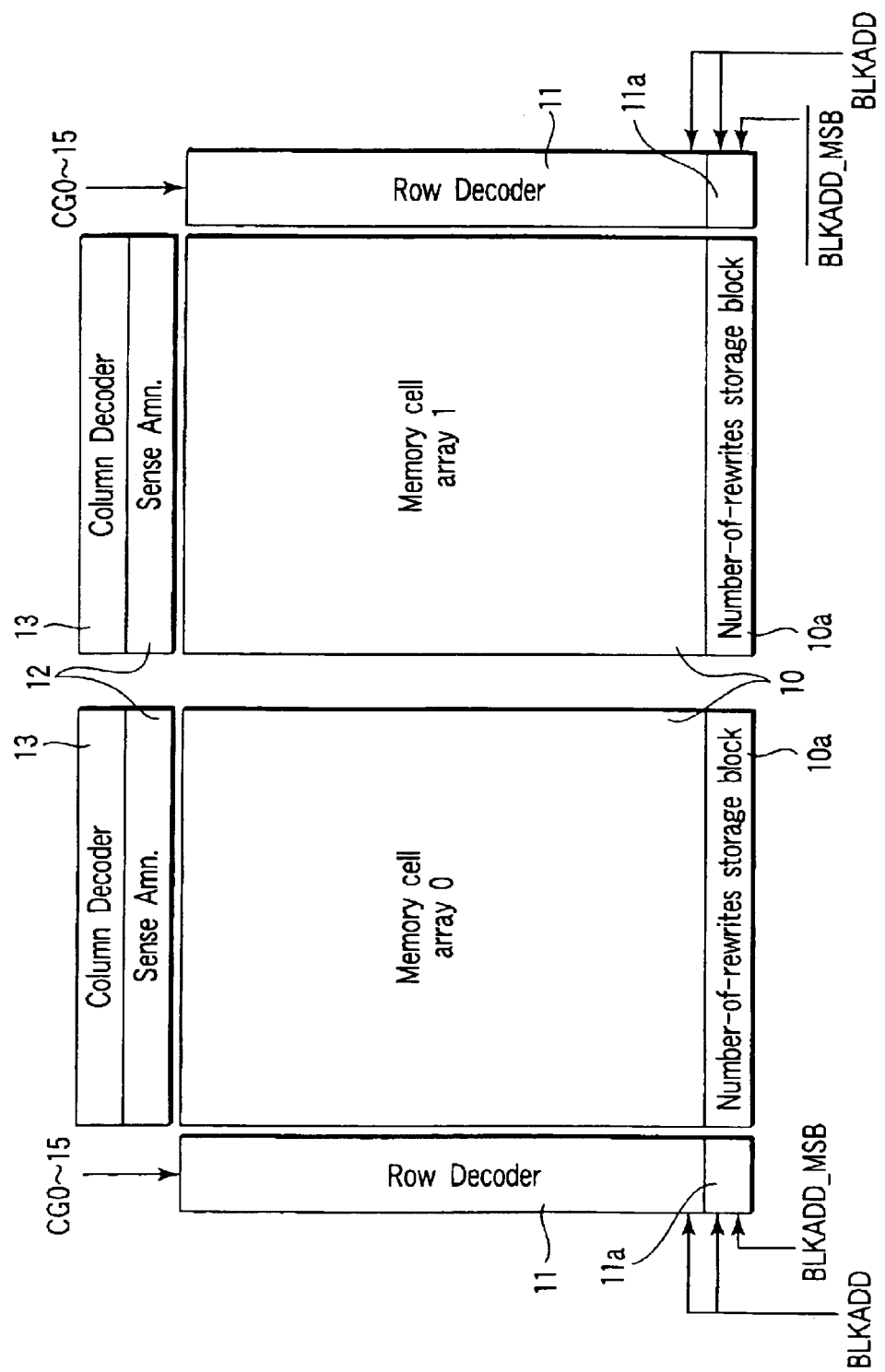
FIG. 1 is a block diagram schematically showing a NAND type flash memory according to a first embodiment of the present invention.

FIG. 1 is a block diagram showing a schematic arrangement of a NAND type flash memory according to a first embodiment of the present invention.

Figure 2:
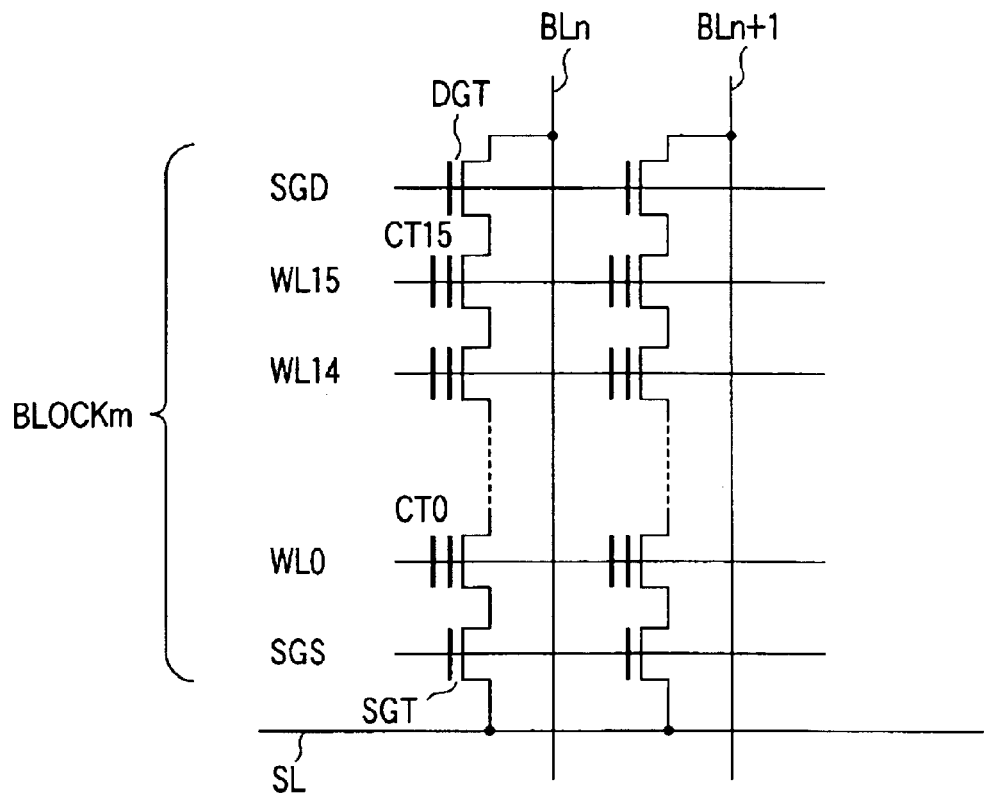
FIG. 2 is an equivalent circuit diagram showing an example of a NAND cell used in a cell block of the NAND type flash memory.

The NAND type flash memory shown in FIG. 1 has arrays of ordinary NAND cells as described with reference to FIG. 2 similarly to a conventional NAND type flash memory. That is, the NAND cell is composed of 16 memory cells CT0 to CT15 connected in series. One ends of the memory cells are connected to bit lines BLi (BLn, BLn+1, . . . ) through a drain side selection gate transistor DGT, while the other ends thereof are connected to a source line through a source side selection gate transistor SGT. Each of the memory cells TC0 to CT10 is composed of a cell transistor having a double layer gate structure of a floating gate and a control gate, and word lines WLi (WL0 to WL15) are connected to the control gate.

Further, a drain side selection gate line SGD is connected to the control gate of the drain side selection gate transistor DGT, while a source side selection gate line SGS is connected to the control gate of the source side selection gate transistor SGT.

In the NAND type flash memory of FIG. 1, a memory cell array 10 is divided into a plurality (2 in this embodiment) of cell blocks 0 and 1 to suppress a bit line capacitance and to execute read at a high speed, similarly to an ordinary NAND type flash memory having a large capacitance.

Incidentally, as bit lines are made finer, a parasitic capacitance between adjacent bit lines increases. To prevent erroneous reading caused by the increase of the parasitic capacitance, in the embodiment, similarly to conventional NAND type flash memories, a bit line shield technology is employed as briefly explained below.

That is, in read, whether or not a precharge potential is discharged by the cell current is determined by floating the bit line. When bit lines have a large width and adjacent bit lines are disposed at large intervals because a design rule is moderate, almost all the parasitic capacitance of a bit line is attributed to the capacitance between the bit line and the substrate, so that a read operation is not effected by the operation of the bit line.

When, however, bit lines are made thinner and intervals therebetween are made smaller by application of a more strict design rule, the parasitic capacitance of the bit lines mainly results from the capacitance therebetween. In such circumstances, a case is examined in which data "0" is written to a memory cell on a target bit line to which notice is paid and data "1" is written to two bit lines adjacent to the target bit line.

In this case, although the precharge potential of the target bit line must be maintained without being discharged, the precharge potentials of the two adjacent bit lines are discharged. Accordingly, the potential of the target bit line is also lowered by the capacitance coupling between the two adjacent bit lines, thereby the data "0" of the memory cell on the target bit line is erroneously read out as data "1".

In the bit line shield technology used to prevent the above disadvantage, alternate bit lines are physically selected, and the potential of not selected bit lines are set to ground potential Gnd. With this arrangement, no erroneous read occurs because the potential difference of the parasitic capacitance between adjacent bit lines is fixed.

Note that in the bit line shield technology described above, a bit line of an even column and a bit line of an odd column are selected in correspondence to each other by a signal BL-even and a signal BL-odd. Further, although the number of memory cells connected to a single word line is doubled, a page size is controlled so as not to be changed by addressing when it is viewed from the outside.

Incidentally, in the NAND type flash memory of FIG. 1, a portion (one block or one page) of a non-selected memory cell array is allocated as a number-of-rewrites storage-region for storing the number of rewrites in analog fashion, and, in the embodiment, number-of-rewrites storage blocks 10a are allocated as the number-of-rewrites storage regions.

The most significant bit BLKADD-MSB and its inverted bit/BLKADD-MSB of a block address for discriminating the pair of memory cell arrays 0 and 1 of the memory cell array 10 are input in correspondence to each other to row decoders 11a corresponding to the number-of-rewrites storage blocks 10a in respective row decoders 11 for selecting the respective rows of the memory cell arrays 0 and 1. The number of data rewrites of the respective arrays are stored in arrays different from these arrays.

Reference numeral 12 denotes sense amplifiers disposed in correspondence to the respective columns of the memory cell array 10, and reference numeral 13 denotes column decoders for selecting columns from the memory cell array 10.

A sense amplifier/data register as described referring to FIG. 8 or a sense amplifier/data register, which will be described later, will be used as the sense amplifier 12 in accordance with embodiments of writing methods as will be described later.

To store the number of data rewrites in the number-of-rewrites storage blocks 10a, write of data is executed to the cell transistors of the number-of-rewrites storage blocks 10a at a voltage lower than an ordinary write voltage, and written data is stored by the analog variation amount of the threshold value of the cell transistors.

When the number of data rewrites is stored in analog fashion by executing write at the low voltage, an erase condition can be sufficiently controlled with accuracy in a degree capable of detecting that the number of data rewrites increases by one digit although storage accuracy is lowered.

Figures 3A, 3B:
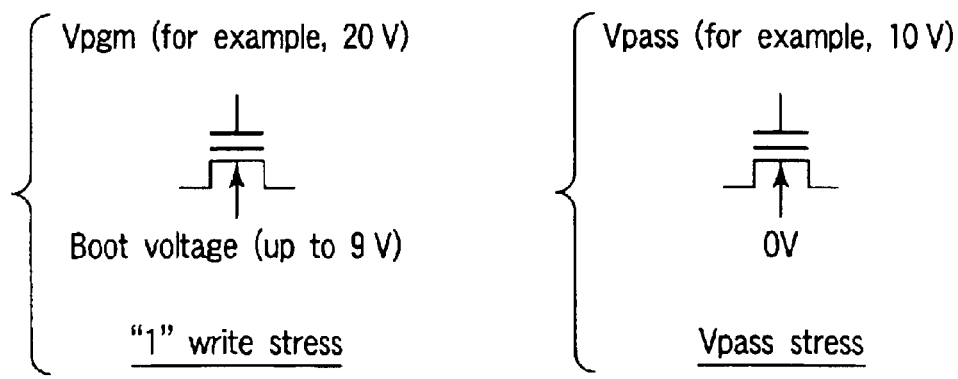
FIG. 3A is a circuit diagram showing a relationship of voltages when write is executed to a cell transistor of a number-of-rewrites storage block of the NAND type flash memory in FIG. 1 making use of "1" write stress.
FIG. 3B is a circuit diagram showing a relationship of voltages when write is executed to the cell transistor of the number-of-rewrites storage block of the NAND type flash memory in FIG. 1 making use of Vpass write stress.

As a method of executing write at the voltage lower than the ordinary write voltage, there are contemplated two kinds of methods as shown in FIGS. 3A and 3B as relations of voltages applied to the cell transistors.

FIG. 3A shows a relation of voltages when write of data is executed to a selected cell transistor making use of "1" write stress.

In ordinary write to the selected cell transistor, write of data to a "1" written cell is prohibited by raising the channel voltage of the selected cell transistor (by supplying a boot voltage up to 9V to a back gate). However, electrons are injected into the floating gate of the cell transistor, although the quantity of them is small, each time a write operation is executed. Accordingly, the threshold value of the cell transistor is increased when the write operation is repeatedly executed.

Thus, to execute write by applying the "1" write stress to the selected cell transistor, Vdd is supplied to the gate of a drain side selected gate transistor (drain side selected gate line SGD) connected in series to the selected cell transistor and to a bit line, respectively, and Vpgm (for example, 20V) is supplied to the gate of the selected cell transistor (selected word line).

FIG. 3B shows a relation of voltages when write of data is executed to a selected cell transistor by making use of Vpass stress.

In ordinary write to the selected cell transistor, Vpass (non-selection word line write voltage, for example, about 10V) is supplied to the gate of a non-selected cell transistor (non-selected word line) connected in series to the selected cell transistor, thereby the voltage of a bit line is transferred to the channel of the selected cell transistor, and a channel voltage is set to 0V.

At this time, since Vpass (for example, about 10V) is about one half Vpgm, the potential difference between the floating gate of the selected cell transistor and the channel is small, and thus the threshold value of the cell transistor does not shift in an ordinary write time. However, since electrons are injected into the floating gate of the cell transistor in a small quantity each time a write operation is executed, the threshold value of the cell transistor is changed when the write operation is repeatedly executed.

The two kinds of the writing methods executed at the low voltage are selected according to the actual write characteristics of memory cells. If the actual write characteristics of a memory cell are not suitable to storing in analog fashion, it may be necessary to adjust a voltage.

Note that the data of the number-of-rewrites storage blocks must not be erased while the device is ordinarily used. Thus, as described below with reference to, for example, FIG. 14, an erase selection prohibiting control fuse element is provided with a row decoder corresponding to the number-of-rewrites storage block, and the fuse element is cut off after the data of the memory cells is erased when the device is shipped. With this arrangement, the data is not erased because the number-of-rewrites storage block is not selected in erasing when the device is ordinarily used.

(First Method of Writing in the Number-of-Rewrites Storage Block of the NAND Type Flash Memory in FIG. 1)

Figure 4:
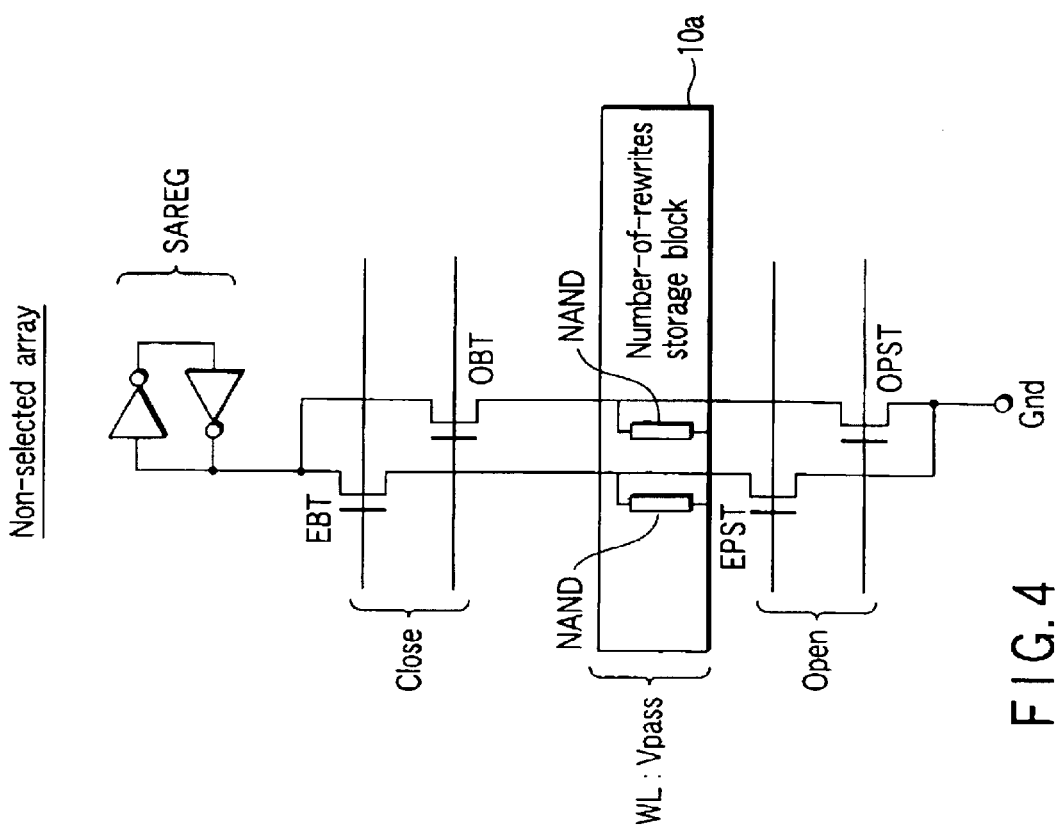
FIG. 4 is a circuit diagram explaining a first method of writing in the number-of-rewrites storage block of the NAND type flash memory in FIG. 1.

FIG. 4 shows a circuit for explaining a first method of writing in the number-of-rewrites storage block of the NAND type flash memory in FIG. 1.

In FIG. 4, reference numeral 10a denotes a number-of-rewrites storage block of a cell block in FIG. 1, and the number-of-rewrites storage block 10a has a NAND group of NAND cells. SAREG simply shows one set of sense amplifier/data register disposed to each pair of bit lines of the cell block in correspondence thereto. The circuit as described with reference to FIG. 8 or the circuit as will be described later with reference to FIG. 9 will be used as the data register SAREG.

One of the I/O nodes of the data register SAREG is commonly connected to the pair of bit lines of the cell block (a bit line of an even number column and a bit line of an odd number column) through a write control transistor (not shown). In this case, the pair of bit lines are selectively connected to the data register SAREG by an even number column bit line selection control transistor EBT connected to one of the NAND cells and an odd number column bit line selection control transistor OBT connected to the other of the NAND cells.

Further, the pair of bit lines are commonly connected to a bit line shield power supply in correspondence to each other through bit line potential selection transistors EPST and OPST, respectively. The bit line shield power supply is set to ground potential Gnd in a read operation and to the power-supply voltage Vdd in a write operation.

The writing method shown in FIG. 4 executes write of data to a selected cell transistor at the low voltage making use of the Vpass stress shown in FIG. 3B. In this method, when write or erase of data is executed to a selected memory cell array 10a, the non-selection word line write voltage Vpass is supplied to the word line of the number-of-rewrites storage block of a non-selected memory cell array and ground potential Gnd is supplied to the bit line connected in series to the cell transistor from the bit line shield power supply.

In this case, the pair of bit line potential selection transistors EPST and OPST are controlled to an "off" state, respectively, and the pair of bit line potential selection transistors EBT and OBT are controlled to an "on" state, respectively.

In this example, the bit line shield power supply is used to set the voltage of the bit line when the number of data rewrites is stored in the cell transistor, which can be realized without additionally providing a special power supply circuit if a control logic for selecting the shield power supply (in this example, the bit line potential selection transistors) is provided.

Note that either the number of data writes or the number of data erases may be stored to store the number of data rewrites. However, it is preferable to store the number of data erases, because it is allowed to execute write of data to the same page in a form of a plurality of divided writes. When the data of a memory cell is to be rewritten, since the data in the block must be entirely erased, thereby the number of data rewrites can be more accurately obtained.

(Second Method of Writing in the Number-of-Rewrites Storage Block of the NAND Type Flash Memory in FIG. 1)

Figure 5:
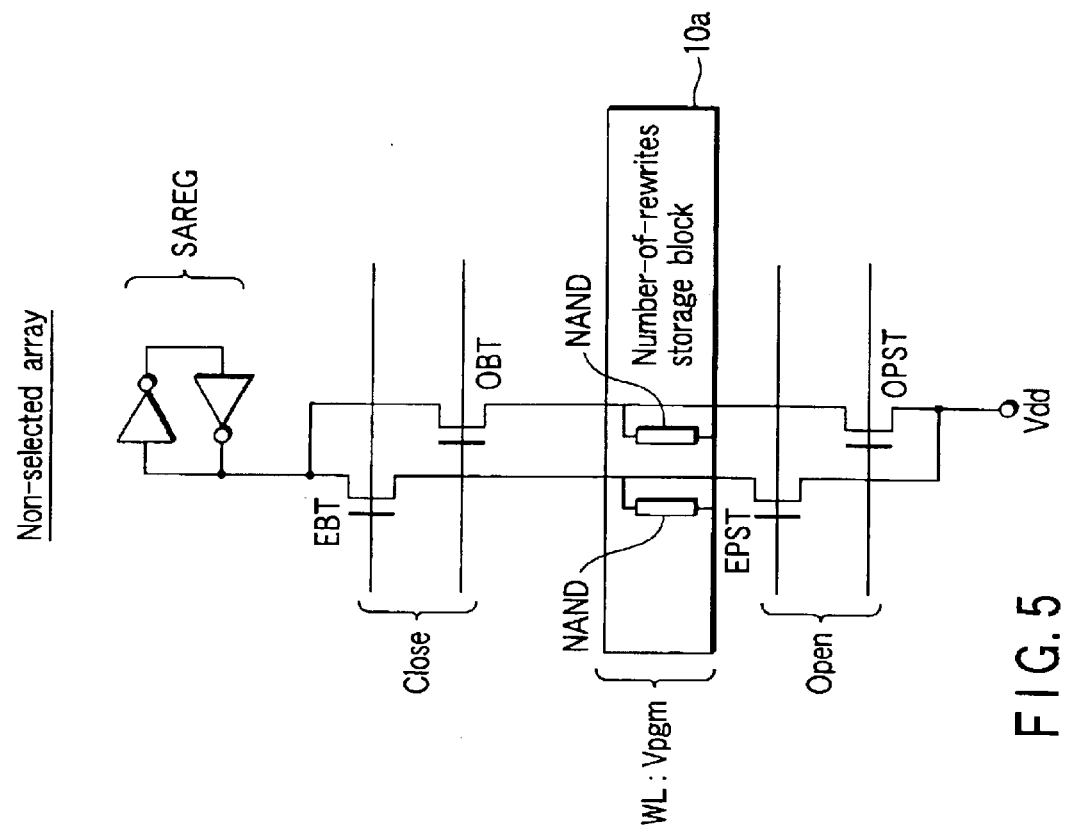
FIG. 5 is a circuit diagram explaining a second method of writing in the number-of-rewrites storage block of the NAND type flash memory in FIG. 1.

FIG. 5 shows a circuit for explaining the second method of writing in the number-of-rewrites storage block in FIG. 1. In FIG. 5, the same components as those in FIG. 4 are denoted by the same reference numerals. The circuit as described with reference to FIG. 8 or the circuit as will be described later with reference to FIG. 9 will be used as a sense amplifier/data register.

The writing method shown in FIG. 5 executes write of data to a selected cell transistor at the low voltage making use of the "1" write stress shown in FIG. 3A. In this method, when write or erase of data is executed to a selected memory cell array, the selection word line write voltage Vpgm (for example, 20V) is supplied to the word line of the number-of-rewrites storage 10a block of a non-selected memory cell array and the power supply voltage Vdd is supplied to the bit line connected in series to the cell transistor from the bit line shield power supply.

(Third Method of Writing in the Number-of-Rewrites Storage Block of the NAND Type Flash Memory in FIG. 1)

Figure 6:
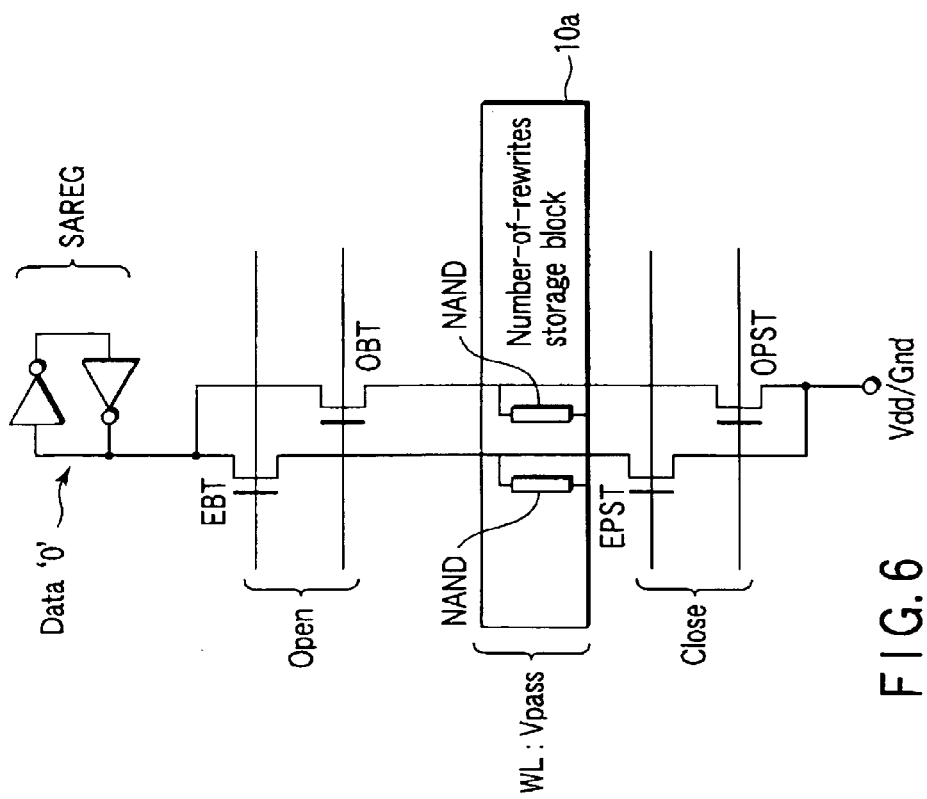
FIG. 6 is a circuit diagram explaining a third method of writing in the number-of-rewrites storage block of the NAND type flash memory in FIG. 1.

FIG. 6 shows a circuit for explaining a third method of writing in the number-of-rewrites storage block in FIG. 1. In FIG. 6, the same components as those in FIG. 4 are denoted by the same reference numerals. The circuit described later with reference to FIG. 9 having "0" reset function will be used as a sense amplifier/data register.

The writing method shown in FIG. 6 executes write of data to a selected cell transistor at the low voltage making use of the Vpass stress shown in FIG. 3B. In this method, when write or erase of data is executed to a selected memory cell array 10a, the non-selection word line write voltage Vpass is supplied to the word line of the number-of-rewrites storage block of a non-selected memory cell array and the power supply voltage Vdd or ground potential Gnd is supplied to the bit line connected in series to the cell transistor from the sense amplifier. This is realized by resetting a sense amplifier/data register, which is connected to bit lines, to a "0" write state and by controlling an even number column bit line selection control transistor and an odd number column bit line selection control transistor to an "on" state.

(Fourth Method of Writing in the Number-of-Rewrites Storage Block of the NAND Type Flash Memory in FIG. 1)

Figure 7:
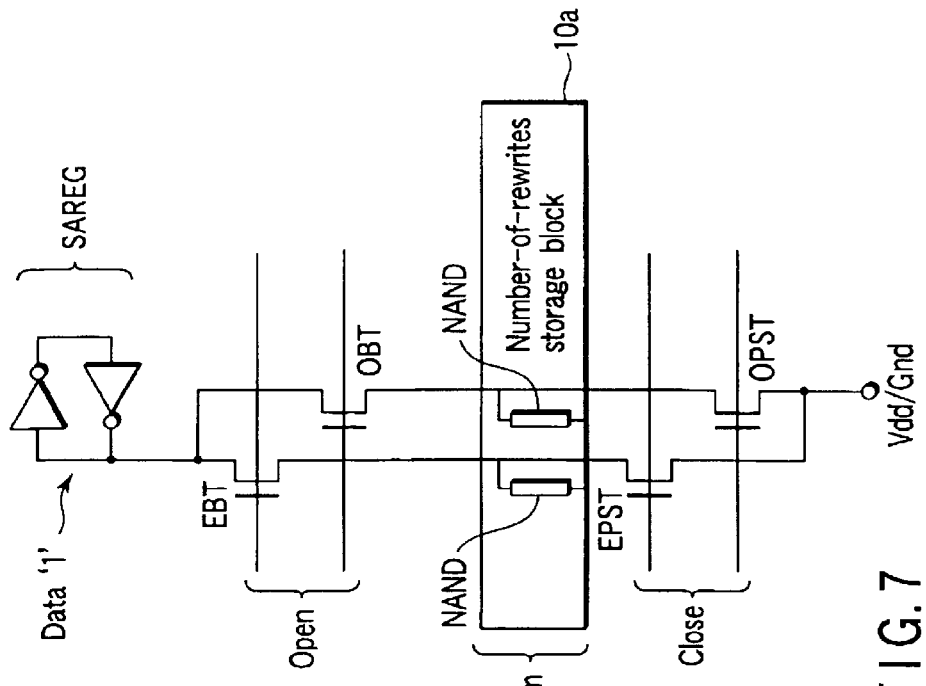
FIG. 7 is a circuit diagram explaining a fourth method of writing in the number-of-rewrites storage block of the NAND type flash memory in FIG. 1.

FIG. 7 shows a circuit for explaining a fourth method of writing in the number-of-rewrites storage block in FIG. 1. In FIG. 7, the same components as those in FIG. 6 are denoted by the same reference numerals. The circuit as described with reference to FIG. 8 or the circuit as will be described later with reference to FIG. 9 will be used as a sense amplifier/data register.

The writing method shown in FIG. 7 executes write of data to a selected cell transistor at the low voltage making use of the "1" write stress shown in FIG. 3A. In this method, when write or erase of data is executed to a selected memory cell array, the selection word line write voltage Vpgm (for example, 20V) is supplied to the word line of the number-of-rewrites storage 10a block of a non-selected memory cell array and the power supply voltage Vdd or ground potential Gnd is supplied to the bit line connected in series to the cell transistor from the sense amplifier. This is realized by applying a reset signal RST1 so as to reset all the sense amplifier/data registers of non-selected memory cell arrays to a "1" write state.

Figure 8:
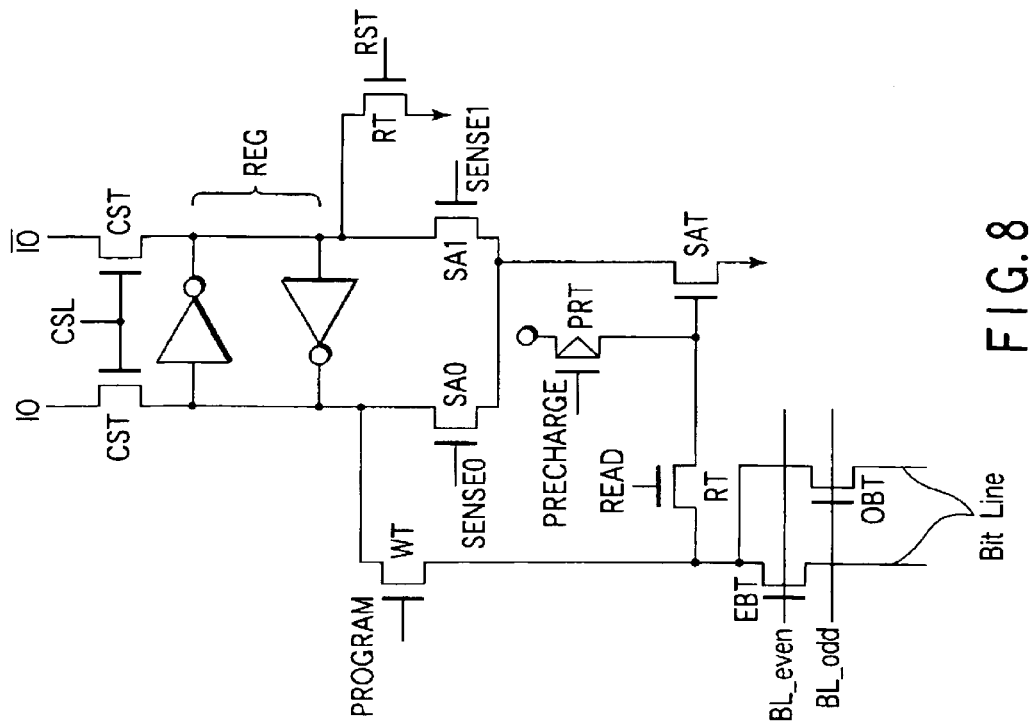
FIG. 8 is a circuit diagram showing an example of a sense amplifier taken out from sense amplifiers without a "0" reset function used in the NAND type flash memory in FIG. 1.

FIG. 8 is a circuit diagram showing an example of one set of sense amplifier/data register without a "0" reset function taken out from sense amplifiers/data registers used in the NAND type flash memory of FIG. 1 in detail, and this circuit is as previously described.

That is, the sense amplifier/data register is arranged such that a pair of sense input transistors SA0 and AS1, and a pair of I/O gate transistors CTS, which are driven by a column selection signal CSL, are connected to a data register (latch circuit) REG composed of two cross-connected inverters. The source common connection node of the pair of sense input transistors SA0 and SA1 is connected ground potential Gnd through a sense amplifying NMOS transistor SAT.

Further, one of the input/output nodes of the data register REG is commonly connected to a pair of bit lines of an even number column and an odd number column through a write control transistor WT controlled by a write signal PROGRAM. In this case, the pair of bit lines of the even number column and the odd number column are selectively connected to the write control transistor WT by an even number column bit line selection control transistor EBT and an odd number column bit line selection control transistor OBT.

A reset transistor RT is connected to the other I/O node of the data register REG to reset the data register to a "1" state and is controlled by a reset signal RST.

In the write operation, write data, which is supplied from a pair of input/output lines IO, /IO through the pair of input/output gate transistors CST, is temporarily held in the data register REG. The write data is transferred to the bit line of a selected even number column or a selected odd number column through the write control transistor WT and the bit line selection control transistor EBT of the selected even number column or the bit line selection control transistor OBT of the selected odd number column. When the write data is "0", 0V is transferred to the bit line, and when the write data is "1", Vdd is supplied thereto.

Figure 9:
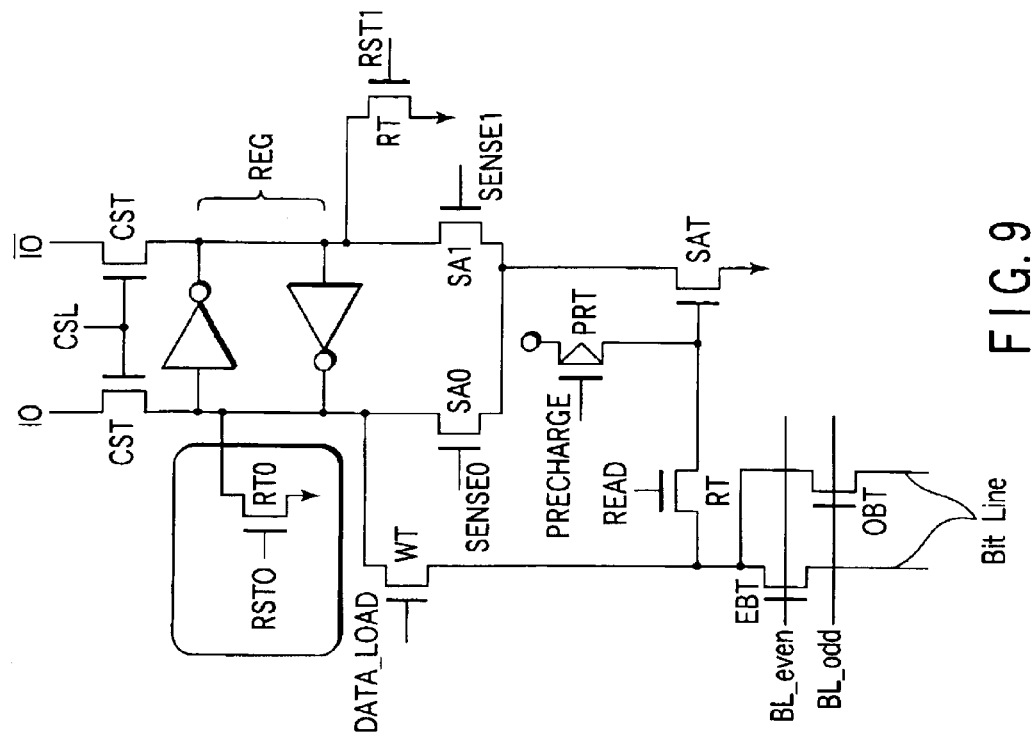
FIG. 9 is a circuit diagram showing an example of a sense amplifier taken out from sense amplifiers with a "0" reset function used in the NAND type flash memory in FIG. 1.

FIG. 9 is a circuit diagram showing an example of one set of sense amplifier/data register with a "0" reset function taken out from sense amplifiers/data registers used in the NAND type flash memory of FIG. 1 in detail.

The sense amplifier/data register is the same as that as described with reference to FIG. 8 except that a reset transistor RT0, which is controlled by a reset signal RST0 for resetting the data register REG to a "0" write state, is added to one of the I/O nodes of the data register REG. Thus, the components of FIG. 9 are denoted by the same reference numerals as those used in FIG. 8.

Accordingly, when the number of data rewrites is to be stored, ground potential Gnd can transferred to the bit lines by applying the reset signal RST0 so as to set all the sense amplifiers/data registers of the non-selected memory cell arrays to the "0" write state at a time.

(Second Embodiment)

Figure 10:
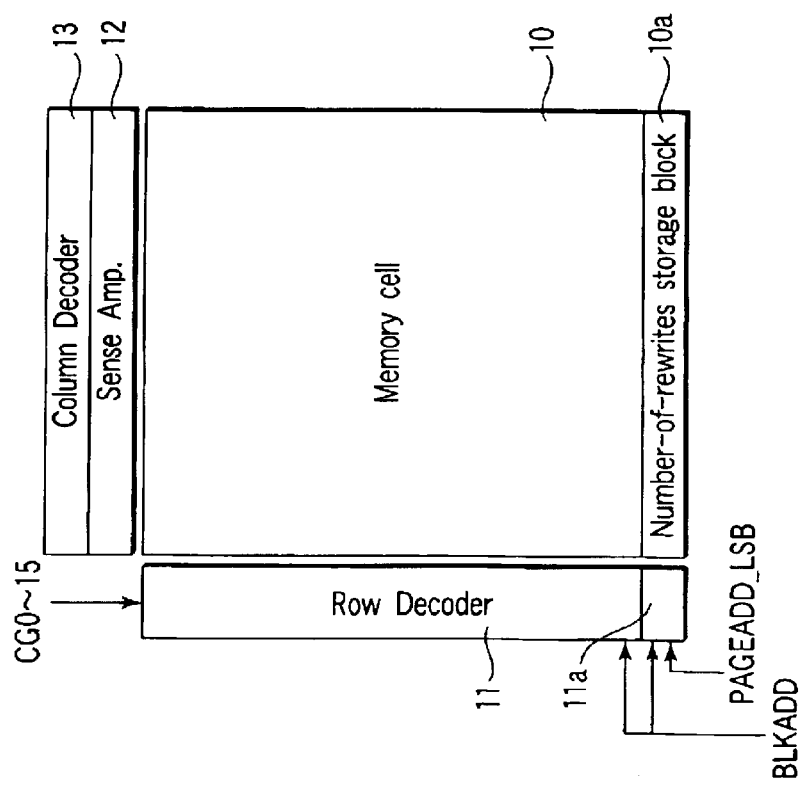
FIG. 10 is a block diagram showing an schematic arrangement of a NAND type flash memory according to a second embodiment of the present invention.

FIG. 10 is a block diagram showing a schematic arrangement of a NAND type flash memory according to a second embodiment of the present invention.

The NAND type flash memory of the second embodiment is the same as that of the first embodiment in that a pair of bit lines (a bit line of an even number column and a bit line of an odd number column) are commonly connected to a sense amplifier and that the bit line shield technology is used.

However, the NAND type flash memory of the second embodiment is different from that of the first embodiment in that one block (or one page) of a selected memory cell array is allocated as a number-of-rewrites storage region (number-of-rewrites storage block 10a in this embodiment) for storing the number of rewrites in analog fashion and that one of the two bit lines connected to the sense amplifier is used to store the number of rewrites.

(Method of Writing in Number-of-Rewrites Storage Block of the NAND Type Flash Memory in FIG. 10)

Figure 11:
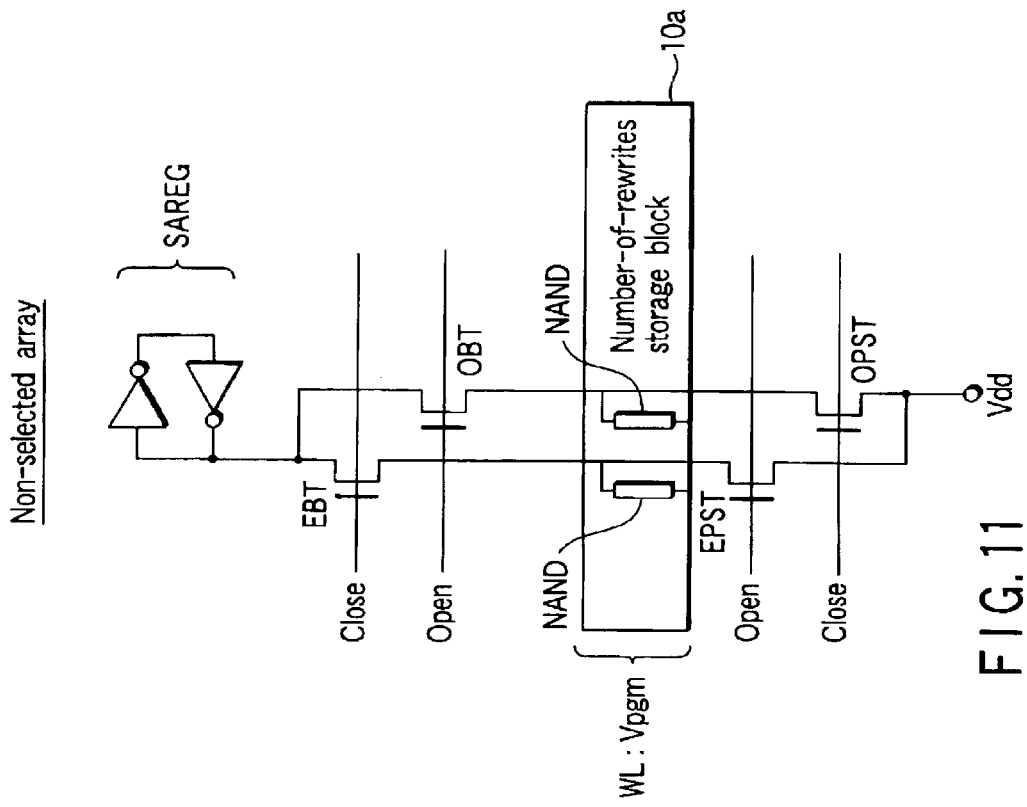
FIG. 11 is a circuit diagram explaining a method of writing in a number-of-rewrites storage block of the NAND type flash memory in FIG. 10.

FIG. 11 is a circuit diagram explaining a method of writing in the number-of-rewrites storage block in FIG. 10. In FIG. 11, the same components as those in FIG. 5 are denoted by the same reference numerals. The circuit described with reference to FIG. 8 or the circuit described with reference to FIG. 9 having "0" reset function will be used as a sense amplifier/data register.

The writing method shown in FIG. 11 executes write of data to a selected cell transistor at the low voltage making use of the "1" write stress shown in FIG. 3A. In this method, when write or erase of data is executed to a selected memory cell array, the selection word line write voltage Vpgm (for example, 20V) is supplied to the word line of the number-of-rewrites storage 10a block of a selected memory cell array and the power supply voltage Vdd is supplied to the bit line connected in series to the selected cell transistor from the bit line shield power supply.

That is, in an example in which a cell transistor of, for example, an even number column in a selected memory cell array is used to store the number of rewrites, Vpgm is supplied to the word line of the number-of-rewrites storage block 10a when write of data is executed to a cell transistor of an odd number column. At this time, since Vdd is supplied to the bit line of the even number column and write of data to the cell transistor of the even number column is prohibited, the state of a "1" write stress occurs.

When write data of the cell transistor of the odd number column is "0", data is written to the cell transistor of the odd number column of the number-of-rewrites storage block 10a and the threshold value of the cell transistor increases. However, the increase in the threshold value does not effect an operation. Further, when electrons in a floating gate increase, the potential difference between the floating gate and a channel decreases, thereby an amount of injection of electrons is saturated.

According to the NAND type flash memory of the second embodiment described above, the number-of-rewrites storage block 10a can store the number of data rewrites even if the memory cell array is not divided into a plurality of sections.

Figure 12:
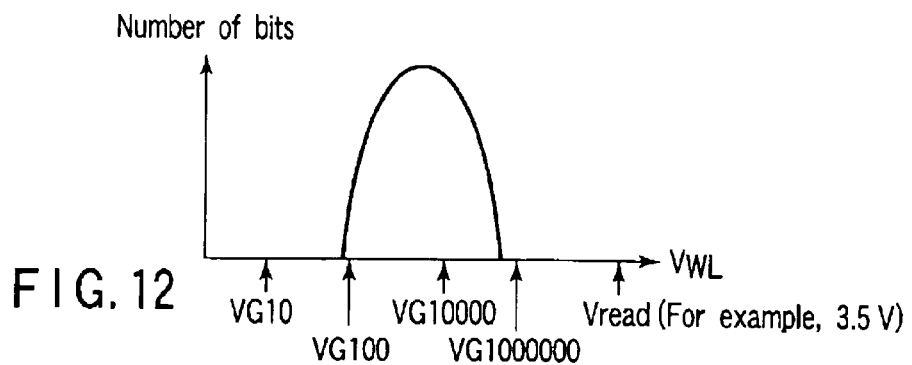
FIG. 12 is a characteristic graph showing an example of a distribution (normal distribution) of threshold values of a cell transistor when the number-of-rewrites is stored in analog fashion in a cell transistor in the NAND type flash memories of the embodiments of present invention.

When the number of data rewrites is stored by analog fashion in a plurality of cell transistors of the number-of-rewrites storage blocks 10a by the respective writing methods as described, the threshold value of a cell transistor exhibits a normal distribution having a certain width as shown in FIG. 12.

Figure 13:
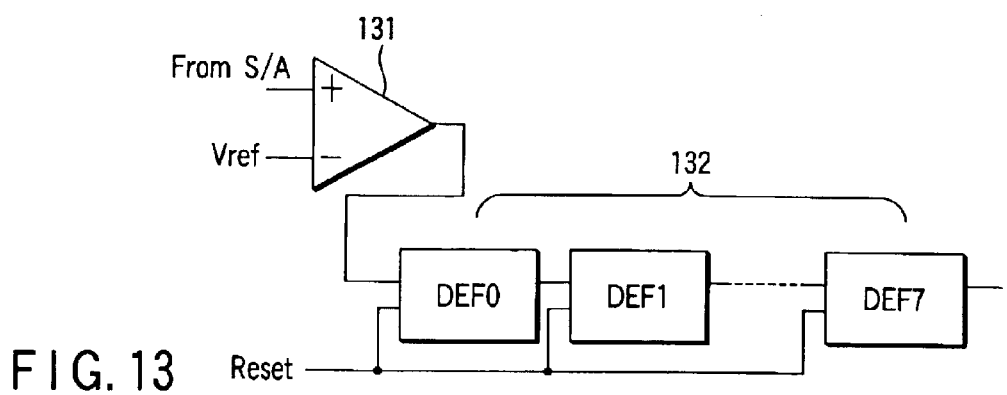
FIG. 13 is a circuit diagram showing an example of a number-of-rewrites reading circuit disposed in the device of each of the embodiments of the present invention.

When the number of data rewrites is determined by being read out from the plurality of cell transistors of the number-of-rewrites storage blocks 10a, there are contemplated (1) a method of determining the center of distribution of threshold values of the plurality of cell transistor by a controller outside of the device and (2) a method of providing a voltage comparison circuit 131 and a counter 132 inside of the device as shown in, for example, FIG. 13 and determining the content of distribution of the threshold values by the counter.

When the voltage of a selected word line is varied in read to read out the number of data rewrites, "1" is read out by the sense amplifier/data register as to the cell transistors having a threshold value less than the voltage of the word line, and "0" is read out by the sense amplifier/data register as to the cell transistors having a threshold value larger than the voltage of the word line.

First, the former method (1) will be described.

The number of data rewrites can be determined in such a manner that the voltage of a word line is changed stepwise from a low level to a high level, the data output from the sense amplifier/data register is serially supplied to the outside of the device as read-out data for one page, the number of the cell transistors read as "1" and the number of the cell transistors read as "0" are counted by the controller outside of the device to thereby determine the center of distribution of the threshold values of the plurality of cell transistors.

At this time, it is possible to determine that the number of the cell transistors at the time the number of the cell transistors that are read as "1" exceeds the total number of the cell transistors in the number-of-rewrites storage blocks indicates the number of data rewrites (determination by decision by a majority).

According to the method (1), no special circuit is necessary in the memory device to read out the number of data rewrites, and a data read circuit in a memory can be also used to read out the number of data rewrites.

Next, the latter method (2) will be described with reference to FIG. 13.

The voltage of the word line connected to the control gate of a cell transistor of the number-of-rewrites storage block is changed stepwise from a low level to a high level, the data output from the sense amplifier/data register is serially read out at respective steps, and the voltage comparison circuit 131 determines whether the output data is "1" or "0". When a result of determination is "0", the number of outputs from the voltage comparison circuit 131 (the number of cell transistors having a threshold value less than the voltage of the word line) is counted by the counter 132, and the number of data rewrites can be determined based on the voltage of the word line at the time the number of the cell transistors having a threshold value less than the voltage of the word line exceeds one half the total number of the cell transistors of the number-of-rewrites storage block.

A NAND type flash memory having the number-of-rewrites storage blocks of, for example, 256 columns, is provided with the number-of-rewrites reading counter 132 composed of 8-bit flip flop circuits DFF0–DFF8 each having a counting capacity of 128 corresponding to one half 256 and with the voltage comparison circuit 131 for determining whether the data output from the sense amplifiers is "1" or "0" in the device in order to determine the number of data rewrites.

In this case, the voltage of the word line connected to the control gate of the cell transistor of the number-of-rewrites storage block is changed stepwise from a low level to a high level, the data output from the sense amplifier/data register is serially read out at respective steps, and the voltage comparison circuit 131 determines whether the output data is "1" or "0". When a result of the determination is "0", the number of outputs from the voltage comparison circuit 131 (the number of cell transistors having a threshold value less than the voltage of the word line) is counted by the counter 132, and the number of data rewrites can be determined based on the voltage of the word line at the time the most significant bit of the counter 132 is inverted from a low level to a high level.

Figure 14:
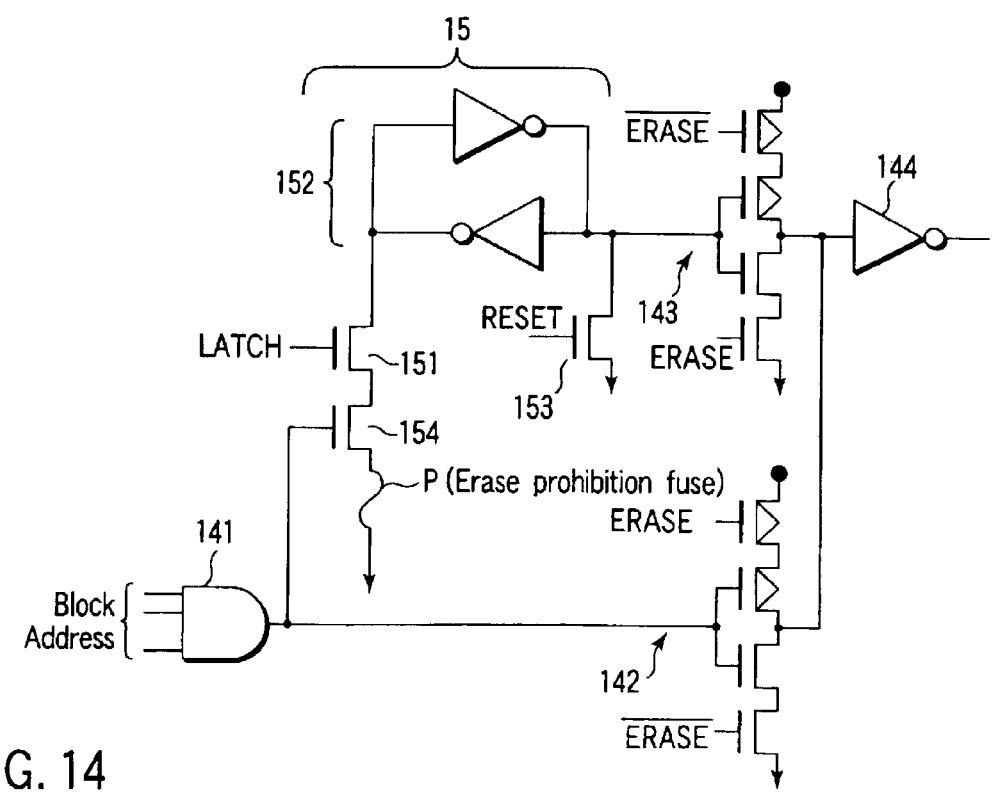
FIG. 14 is a circuit diagram showing an example in which a row decoder corresponding to the number-of-rewrites storage block of the NAND type flash memory in FIG. 1 or FIG. 10 has an erase selection prohibiting fuse.

FIG. 14 is a circuit diagram showing an example in which a row decoder 11*a* corresponding to the number-of-rewrites storage block 10*a* in FIG. 1 or FIG. 10 is provided with an erase selection prohibition control fuse element F.

The row decoder 11*a* includes an AND gate 141, to which an block address signal Block Address is input, a first inverter 142, which is activated by complementary erase control signals ERASE, /ERASE and inverts the output from the AND gate, a latch circuit 15, which is activated by a latch control signal LATCH and latches the output from the AND gate 141 and whose latch signal is reset by a reset signal RESET, a second inverter 143, which is activated complementarily with the first inverter 142 by the complementary erase control signals ERASE, /ERASE and inverts the output from the latch circuit 15, and a third inverter 144 which inverts a signal to which the respective outputs from the second and first inverters 143 and 142 are wired-or-connected.

The output from the third inverter 144 (voltage output from the row decoder) is supplied to the gate (word line) of a cell transistor of a NAND cell and to the gate (selection gate line) of a selected gate transistor through a voltage conversion circuit, not shown.

The latch circuit 15 is composed of an activation control NMOS transistor 151 having a gate to which a latch control signal LATCH is input, a latch circuit 152, in which two inverters are connected in inverted parallel with each other and the input terminal of which is connected to one end of the NMOS transistor 151, a reset NMOS transistor 153 connected between the output terminal of the latch circuit 152 and the ground node and having a gate to which a reset signal is input, a latch input control NMOS transistor 154 having an end connected to the other end of the activation control NMOS transistor 151, and an erase selection prohibition fuse element 155 connected between the other end of the latch input control NMOS transistor 154 and the ground node.

When the fuse element 155 is conducting, the latch input control NMOS transistor 154 can execute an operation, and the row decoder can execute a decode operation in erase. Whereas, when the fuse element 155 is nonconducting (cut off), the latch input control NMOS transistor 154 cannot execute the operation and the row decoder cannot execute the decode operation in erase. Accordingly, the number-of-rewrites storage blocks are not selected in erase.

It should be noted that, in the respective embodiments, there has been explained the example in which the NAND cell, which is connected to the bit line of an odd number cell or to bit line of an even number column in one block (or one page) in a non-selected memory array or in one block (or one page) in a selected memory array, is allocated as the number-of-rewrites storage region. However, the present invention is by no means limited thereto, and dedicated number-of-rewrites storage cells, each of which is composed of selection gate transistors one of which is connected to an end of a cell transistor and the other of which is connected to the other end of the cell transistor, may be additionally provided for one line of a plurality of lines, and the number of data rewrites may be stored in the number-of-rewrites storage cells in a manner similar to those of the respective embodiments as described.

Also, in the respective embodiments, the number-of-rewrites storage blocks may be provided at the outside of the memory cell array. Furthermore, in the respective embodiments, the number-of-rewrites storage blocks may be provided at the outside of the nonvolatile semiconductor memory.

Further, although the NAND type flash memory has been described in the respective embodiments, the present invention is by no means limited thereto, and it is also possible to apply the present invention to other non-volatile semiconductor memories.

As described above, according to the non-volatile semiconductor memories of the respective embodiments, since the number of data rewrites is stored in storage devices similar to the memory cells in analog fashion, rewrite can be controlled by a smaller number of circuits without providing many registers and the like which are required conventionally.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory comprising:
   a plurality of memory cell arrays each having a number-of-rewrites storage region; and
   a number-of-rewrites write control circuit which stores the number of rewrites in cell transistors.

2. A non-volatile semiconductor memory according to claim 1, wherein the cell transistors are contained in the number-of-rewrites storage regions in non-selected memory cell arrays, and the number-of-rewrites write control circuit stores the number of rewrites in the cell transistors of the number-of-rewrites storage regions in non-selected memory cell arrays by executing write of data to the cell transistors at a voltage lower than an ordinary write voltage.

3. A non-volatile semiconductor memory according to claim 2, wherein the cell transistors are contained in the number-of-rewrites storage regions in non-selected memory cell arrays, and when write of data is executed to the cell transistors of the number-of-rewrites storage regions in the non-selected memory cell arrays at the voltage lower than the ordinary write voltage, the write of data is executed making use of "1" write stress to the cell transistors by applying a predetermined power-supply voltage to bit lines connected in series to the cell transistors and applying a write voltage Vpgm to the gates of the cell transistors.

4. A non-volatile semiconductor memory according to claim 3, wherein sense amplifiers/data registers are provided to corresponding bit lines in the memory cell arrays, and the power-supply voltage to the bit lines are supplied from the sense amplifiers/data registers.

5. A non-volatile semiconductor memory according to claim 2, wherein the cell transistors are contained in the number-of-rewrites storage regions in non-selected memory cell arrays, and when write of data is executed to the cell transistors of the number-of-rewrites storage regions in the non-selected memory cell arrays at the voltage lower than the ordinary write voltage, the write of data is executed making use of Vpass stress to the cell transistors by applying a non-selected memory cell voltage Vpass lower than the write voltage to the control gates of the cell transistors and applying ground potential Gnd to bit lines connected in series to the cell transistors.

6. A non-volatile semiconductor memory according to claim 5, wherein sense amplifiers/data registers are provided to corresponding bit lines in the memory cell arrays, and the ground voltage to the bit lines are supplied from the sense amplifiers/data registers.

7. A non-volatile semiconductor memory according to claim 1, wherein, when the number of data rewrites is read out from the cell transistors of the number-of-rewrites storage regions which stores the number of data rewrites, read out data is output to the outside of the device.

8. A non-volatile semiconductor memory according to claim 7, wherein the number of data rewrites is determined by determining a center of distribution of threshold values of the cell transistors based on data read out from the cell transistors.

9. A non-volatile semiconductor memory according to claim 7, wherein a counter is provided so as to be used when the number of data rewrites is read out, and, when the number of data rewrites is read out from the cell transistors of the number-of-rewrites storage regions which stores the number of data rewrites, a voltage of word lines connected to control gates of the cell transistors is changed, and a result of read of the number of data rewrites is serially output to the outside of the device as data read out for one page.

10. A non-volatile semiconductor memory according to claim 1, wherein, when the number of data rewrites is read out from the cell transistors of the number-of-rewrites storage regions which stores the number of data rewrites, a voltage of word lines connected to the control gates of the cell transistors is changed, and the number of data rewrites is determined based on the voltage of the word line at the time the number of cell transistors having a threshold value less than the voltage of the word line exceeds one half a total number of the cell transistors in the number-of-rewrites storage regions.

11. A non-volatile semiconductor memory according to claim 10, wherein the number of data rewrites is determined by determining a center of distribution of threshold values of the cell transistors based on data read out from the cell transistors.

12. A non-volatile semiconductor memory according to claim 1, wherein a counter is provided so as to be used when the number of data rewrites is read out, and, when the number of data rewrites is read out from the cell transistors of the number-of-rewrites storage regions which stores the number of data rewrites, a voltage of the word lines connected to control gates of the cell transistors is changed, and the counter is counted up when the cell transistors have a threshold value less than the voltage of the word line, and the number of data rewrites is determined based on the voltage of the word line at the time the most significant bit of the counter is inverted.

13. A non-volatile semiconductor memory according to claim 12, wherein the number of data rewrites is determined by determining a center of distribution of threshold values of the cell transistors based on data read out from the cell transistors.

14. A non-volatile semiconductor memory according to claim 1, wherein row decoders which correspond to the number-of-rewrites storage regions are provided, each of the row decoders include a fuse for use in prohibition of erase selection, and the fuse is cut off after data of the memory cells are erased when the memory is shipped.

15. A non-volatile semiconductor memory comprising:
   a plurality of memory cell arrays each having a number-of-rewrites storage region;
   a plurality of sense amplifiers/data registers commonly connected to a pair of bit lines of a pair of even and odd columns in each of the memory cell arrays; and
   a number-of-rewrites write control circuit which stores, when data is written to cell transistors connected to one of the pair of bit lines of the pair of even and odd columns in the number-of-rewrites storage regions of selected memory cell arrays, the number of rewrites to cell transistors connected to the other of the pair of bit lines.

16. A non-volatile semiconductor memory according to claim 15, wherein the number-of-rewrites write control circuit stores the number of rewrites to the cell transistors connected to said other of the pair of bit lines by executing write by supplying the cell transistors with a voltage lower than an ordinary write voltage.

17. A non-volatile semiconductor memory according to claim 16, wherein when the write of data is executed to the cell transistors connected to said other bit line at the voltage lower than the ordinary write voltage, the write of data is executed making use of "1" write stress to the cell transistors by applying a predetermined power-supply voltage to bit lines connected in series to the cell transistors and applying a write voltage Vpgm to the gates of the cell transistors.

18. A non-volatile semiconductor memory according to claim 17, wherein sense amplifiers/data registers are provided to corresponding bit lines in the memory cell arrays, and the power-supply voltage to the bit lines are supplied from the sense amplifiers/data registers.

19. A non-volatile semiconductor memory according to claim 16, wherein when the write of data is executed to the cell transistors connected to said other bit line at the voltage lower than the ordinary write voltage, the write of data is executed making use of Vpass stress to the cell transistors by applying a non-selected memory cell voltage Vpass lower than the write voltage to the control gates of the cell transistors and applying ground potential Gnd to bit lines connected in series to the cell transistors.

20. A non-volatile semiconductor memory according to claim 19, wherein sense amplifiers/data registers are provided to corresponding bit lines in the memory cell arrays, and the ground voltage to the bit lines are supplied from the sense amplifiers/data registers.

21. A non-volatile semiconductor memory according to claim 19, wherein, when the number of data rewrites is read out from the cell transistors of the number-of-rewrites storage regions which stores the number of data rewrites, read out data is output to the outside of the device.

22. A non-volatile semiconductor memory according to claim 21, wherein the number of data rewrites is determined by determining a center of distribution of threshold values of the cell transistors based on data read out from the cell transistors.

23. A non-volatile semiconductor memory according to claim 21, wherein a counter is provided so as to be used when the number of data rewrites is read out, and, when the number of data rewrites is read out from the cell transistors connected to said other bit line, a voltage of word lines connected to control gates of the cell transistors is changed, and a result of read of the number of data rewrites is serially output to the outside of the device as data read out for one page.

24. A non-volatile semiconductor memory according to claim 19, wherein, when the number of data rewrites is read out from the cell transistors of the number-of-rewrites storage regions which stores the number of data rewrites, a voltage of the word lines connected to the control gates of the cell transistors is changed, and the number of data rewrites is determined based on the voltage of the word line at the time the number of cell transistors having a threshold value less than the voltage of the word line exceeds one half the total number of the cell transistors in the number-of-rewrites storage regions.

25. A non-volatile semiconductor memory according to claim 24, wherein the number of data rewrites is determined by determining a center of distribution of threshold values of the cell transistors based on data read out from the cell transistors.

26. A non-volatile semiconductor memory according to claim 15, wherein a counter is provided so as to be used when the number of data rewrites is read out, and, when the number of data rewrites is read out from the cell transistors of the number-of-rewrites storage regions which stores the number of data rewrites, a voltage of the word lines connected to control gates of the cell transistors is changed, and the counter is counted up when the cell transistors have a threshold value less than the voltage of the word line, and the number of data rewrites is determined based on the voltage of the word line at the time the most significant bit of the counter is inverted.

27. A non-volatile semiconductor memory according to claim 26, wherein the number of data rewrites is determined by determining a center of distribution of threshold values of the cell transistors based on data read out from the cell transistors.

* * * * *